United States Patent
Ueda et al.

(10) Patent No.: US 8,772,646 B2
(45) Date of Patent: Jul. 8, 2014

(54) PRINTED WIRING BOARD AND METHOD FOR MANUFACTURING PRINTED WIRING BOARD

(75) Inventors: Kazuyuki Ueda, Ogaki (JP); Takema Adachi, Ogaki (JP); Kazuhiro Yoshikawa, Ogaki (JP)

(73) Assignee: Ibiden Co., Ltd., Ogaki-shi (JP)

(*) Notice: Subject to any disclaimer, the term of this patent is extended or adjusted under 35 U.S.C. 154(b) by 182 days.

(21) Appl. No.: 13/427,983

(22) Filed: Mar. 23, 2012

(65) Prior Publication Data

US 2012/0247813 A1    Oct. 4, 2012

Related U.S. Application Data

(60) Provisional application No. 61/468,742, filed on Mar. 29, 2011.

(51) Int. Cl.
*H05K 1/11* (2006.01)
*H05K 1/00* (2006.01)
*H05K 1/03* (2006.01)

(52) U.S. Cl.
USPC ........... 174/262; 174/252; 174/255; 174/264; 174/265; 174/266

(58) Field of Classification Search
USPC ............. 174/252, 255, 262–266; 361/794
See application file for complete search history.

(56) References Cited

U.S. PATENT DOCUMENTS

| 6,613,413 B1* | 9/2003 | Japp et al. ............. 428/131 |
| 2007/0044999 A1* | 3/2007 | Shibata et al. ............ 174/262 |
| 2007/0290327 A1* | 12/2007 | Nakasato et al. ............ 257/698 |

FOREIGN PATENT DOCUMENTS

| JP | 2004-140216 | 5/2004 |
| JP | 2004-311849 | 11/2004 |

* cited by examiner

*Primary Examiner* — Jeremy C Norris
*Assistant Examiner* — Sherman Ng
(74) *Attorney, Agent, or Firm* — Oblon, Spivak, McClelland, Maier & Neustadt, L.L.P.

(57) ABSTRACT

A method for manufacturing a printed wiring board includes preparing a metal sheet having metal members and connectors joining the metal members, forming a structure having core substrates which are connected through the connectors and which have insulation structure portions covering the metal members, respectively, cutting the connectors in the structure such that an independent core substrate having a recessed portion is formed and a respective one of the connectors is removed from the independent core substrate, and covering the recess portion of the independent core substrate with a resin. The covering of the recess portion includes either forming an interlayer insulation layer on a surface of the independent core substrate or forming interlayer insulation layers on opposing surfaces of the independent core substrate.

15 Claims, 12 Drawing Sheets

(A)

(B)

(C)

(A)

(B)

(A)

(B)

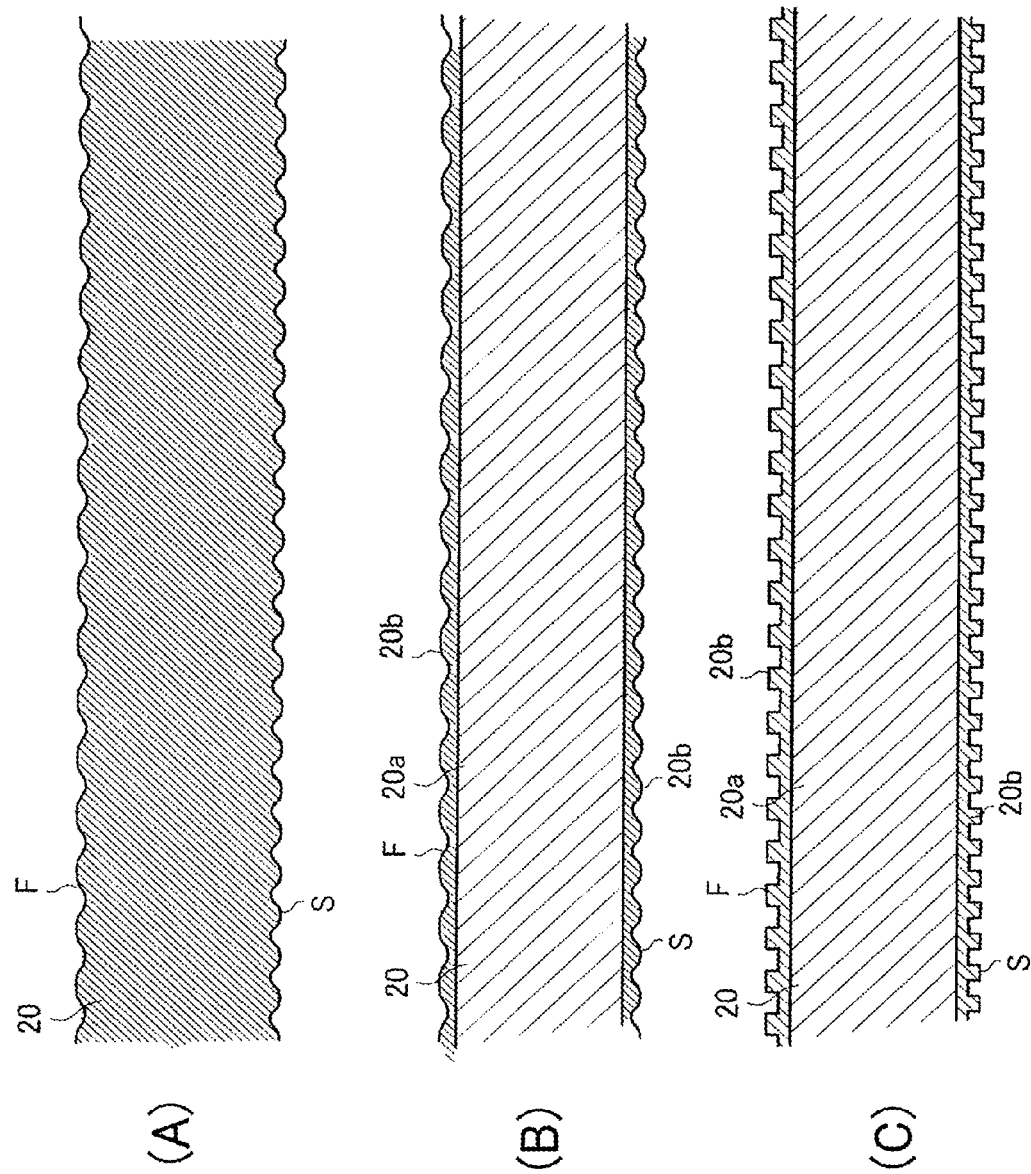

PRINTED WIRING BOARD AND METHOD FOR MANUFACTURING PRINTED WIRING BOARD

CROSS-REFERENCE TO RELATED APPLICATIONS

The present application is based on and claims the benefit of priority to U.S. Application No. 61/468,742, filed Mar. 29, 2011, the entire contents of which are incorporated herein by reference.

BACKGROUND OF THE INVENTION

1. Field of the Invention

The present invention relates to a printed wiring board in which interlayer insulation layers and conductive circuits are laminated on a core substrate made by laminating insulation layers on a metal board, and whose upper and lower surfaces are electrically connected by a through hole. The present invention also relates to a method for manufacturing such a printed wiring board.

2. Discussion of the Background

Japanese Laid-Open Patent Publication No. 2004-140216 describes a multilayer printed wiring board where a metal board with high thermal conductivity is layered in a core substrate. A manufacturing method in Japanese Laid-Open Patent Publication No. 2004-311849 describes forming resin layers on a panel where individual metal boards are joined by tie bars and separating individual metal boards by cutting the tie bars through router processing. The entire contents of these publications are incorporated herein by reference.

SUMMARY OF THE INVENTION

According to one aspect of the present invention, a method for manufacturing a printed wiring board includes preparing a metal sheet having metal members and connectors joining the metal members, forming a structure having core substrates which are connected through the connectors and which have insulation structure portions covering the metal members, respectively, cutting the connectors in the structure such that a independent core substrate having a recessed portion on a peripheral portion of the independent core substrate is formed and a respective one of the connectors is removed from the independent core substrate, and covering the recess portion of the independent core substrate with a resin. The covering of the recess portion includes either forming an interlayer insulation layer on a surface of the independent core substrate or forming interlayer insulation layers on opposing surfaces of the independent core substrate.

According to another aspect of the present invention, a printed wiring board includes a core substrate having a first surface and a second surface on the opposite side of the first surface of the core substrate, a first conductive circuit formed on the first surface of the core substrate, a second conductive circuit formed on the second surface of the core substrate, a through-hole conductor formed through the core substrate and connecting the first conductive circuit and the second conductive circuit, a first interlayer insulation layer formed on the first conductive circuit, and a second interlayer insulation layer formed on the second conductive circuit. The core substrate has an insulation structure and a metal member positioned inside the insulation structure, the metal member has a penetrating hole through which the through-hole conductor is passing through, the metal member has a recessed portion on a peripheral portion of the metal member, and the recessed portion is covered with a resin derived from the first interlayer insulation layer and/or the second interlayer insulation layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 8(A) shows a state prior to processing and FIG. 8(B) shows a state after processing;

FIG. 10(A) shows a state prior to processing and FIG. 10(B) shows a state after processing;

FIGS. 12(A)-12(C) are cross-sectional views of a metal member in the first embodiment and the second embodiment.

DETAILED DESCRIPTION OF THE EMBODIMENTS

Figure 1:
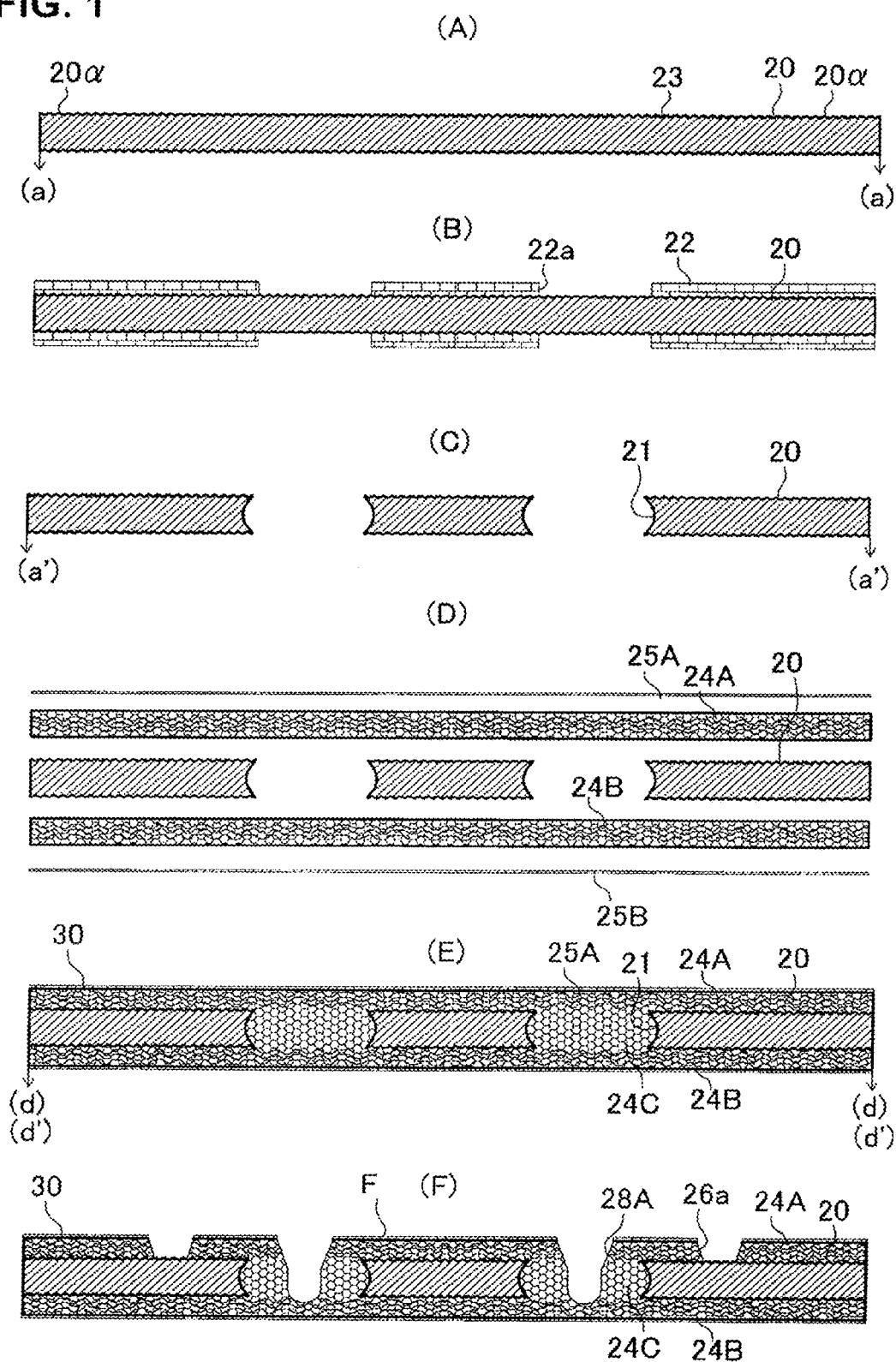
FIGS. 1(A)-1(F) are views of steps showing a method for manufacturing a printed wiring board according to an embodiment of the present invention.
Figure 2:
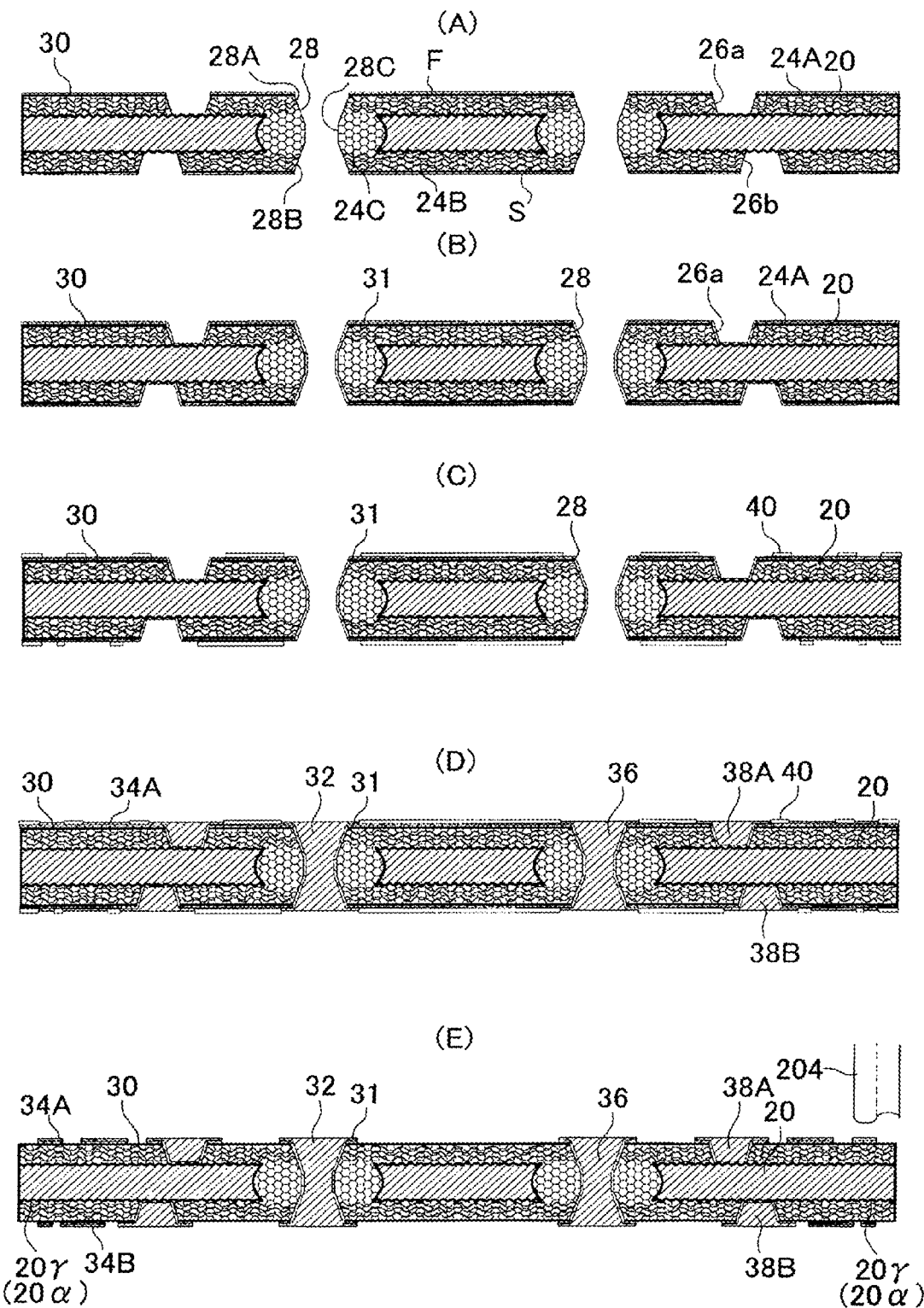
FIGS. 2(A)-2(E) are views of steps showing the method for manufacturing a printed wiring board according to the embodiment.
Figure 3:
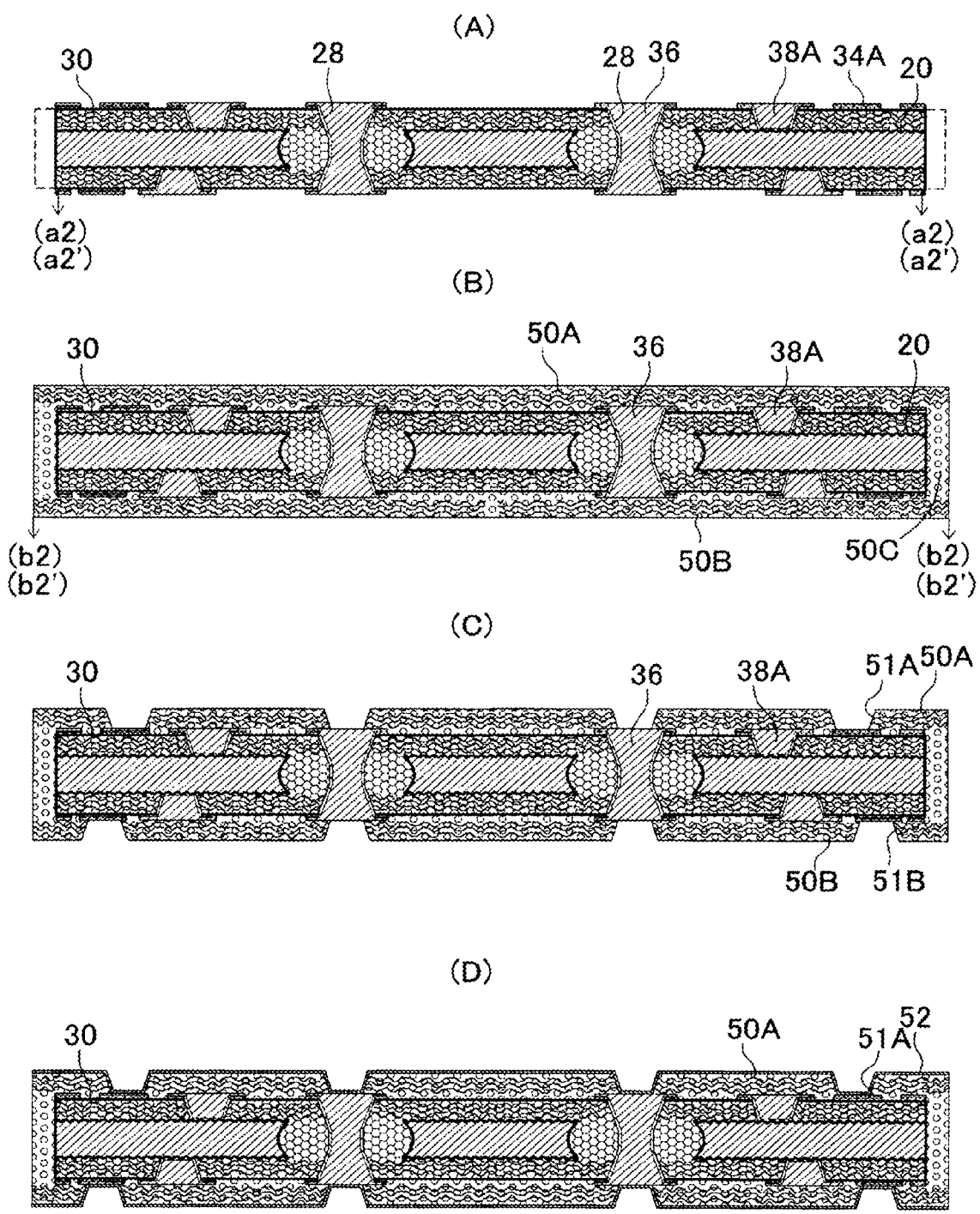
FIGS. 3(A)-3(D) are views of steps showing the method for manufacturing a printed wiring board according to a first embodiment.
Figure 4:
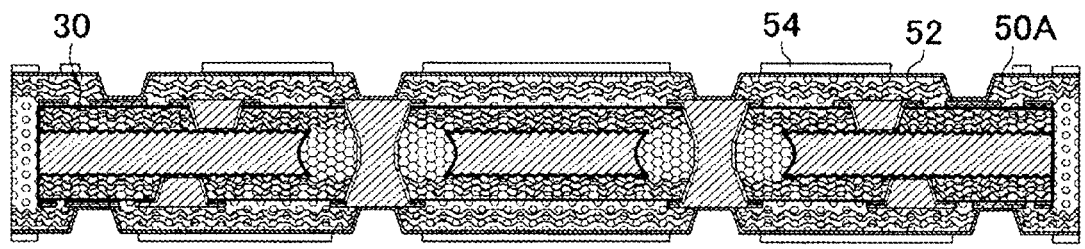
FIGS. 4(A)-4(C) are views of steps showing the method for manufacturing a printed wiring board according to the first embodiment.
Figure 4:
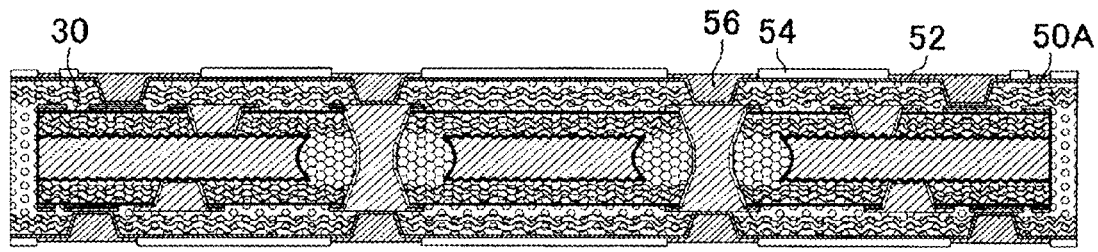
Figure 4:
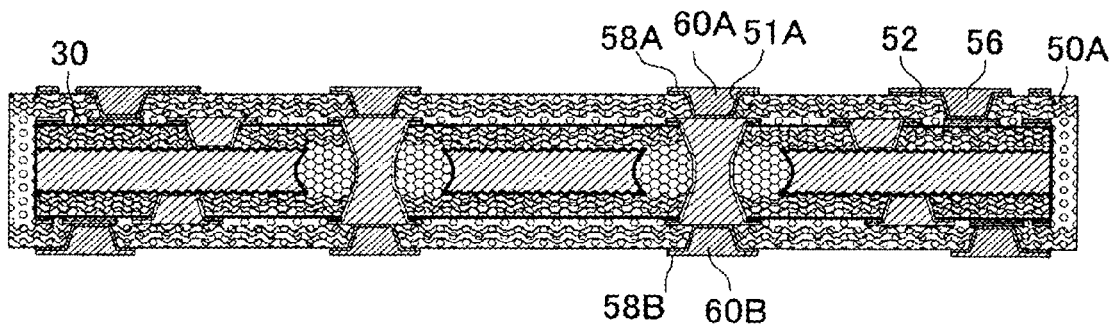
Figure 5:
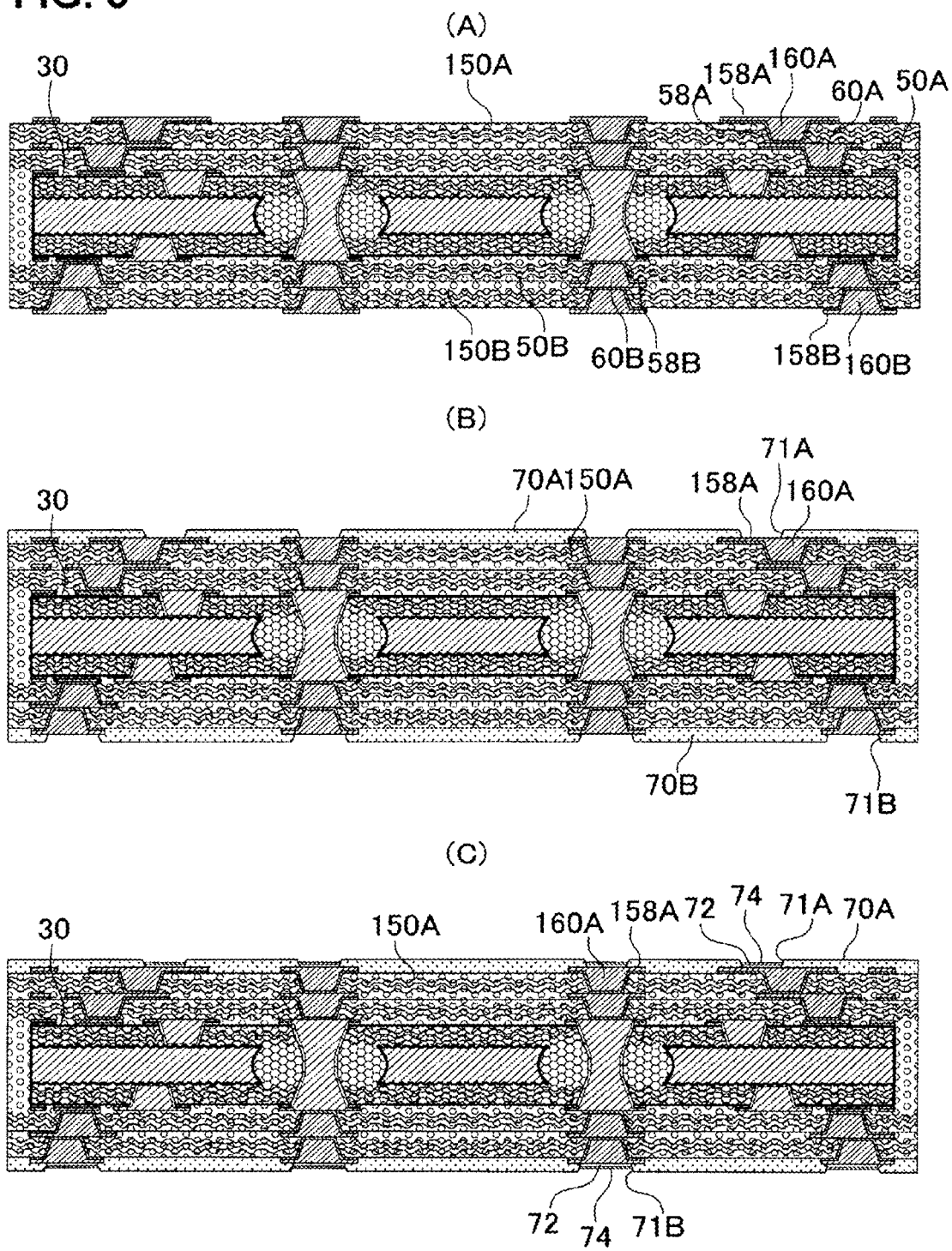
FIGS. 5(A)-5(C) are views of steps showing the method for manufacturing a printed wiring board according to the first embodiment.

The embodiments will now be described with reference to the accompanying drawings, wherein like reference numerals designate corresponding or identical elements throughout the various drawings.

First Embodiment

Figure 6:
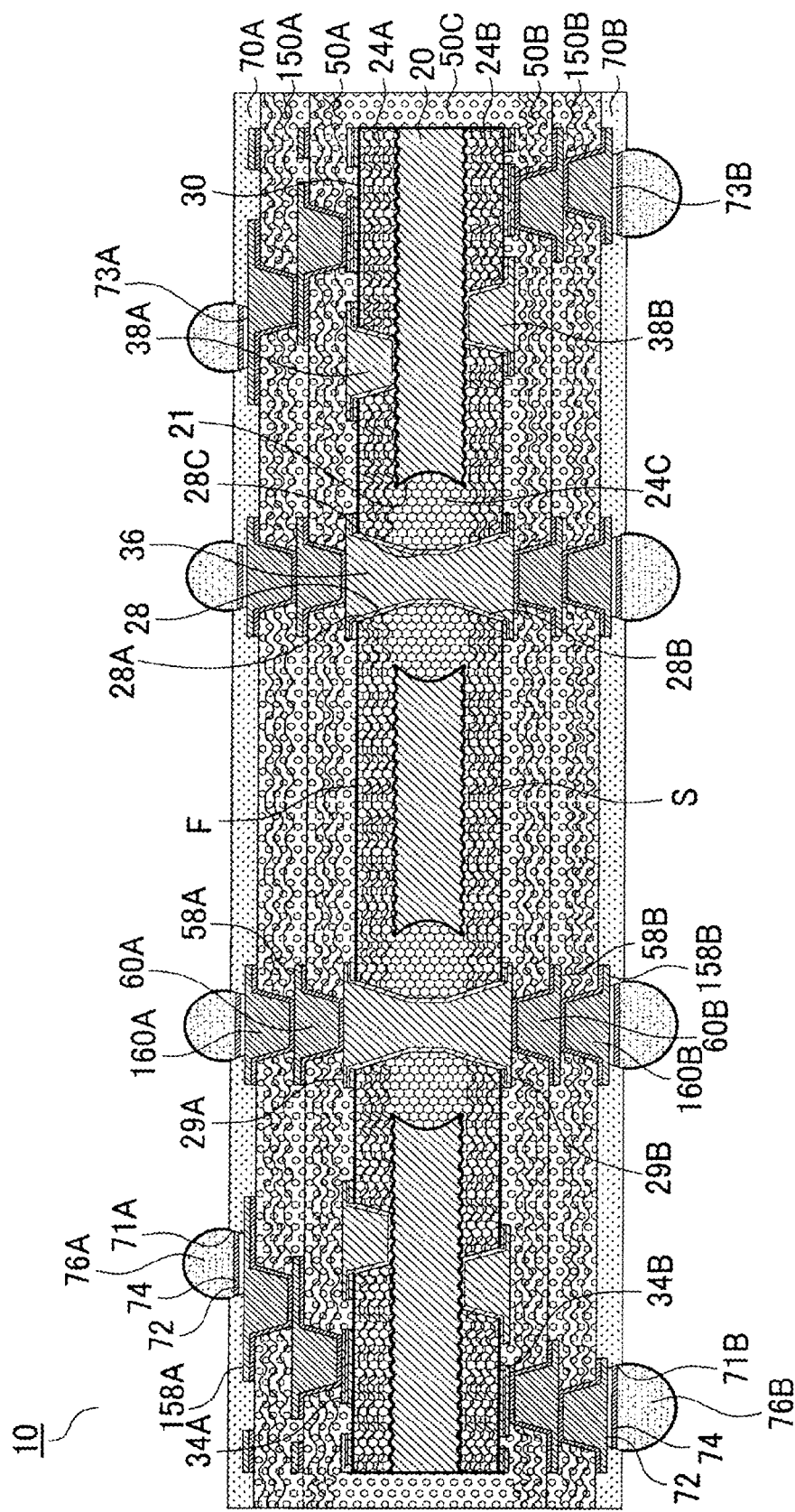
FIG. 6 is a cross-sectional view of a printed wiring board according to the embodiment before an IC chip is mounted.

Multilayer printed wiring board 10 according to the first embodiment is described with reference to FIG. 6. FIG. 6 shows a cross-sectional view of multilayer printed wiring board 10. In multilayer printed wiring board 10, first conductive circuit (34A) and first land (29A) are formed on first surface (F) of core substrate 30 having metal member 20 inside, and second conductive circuit (34B) and second land (29B) are formed on the second surface. The first conductive circuit and the second conductive circuit are connected by through-hole conductor 36. The first land and the second land are connected by through-hole conductor 36.

Upper first interlayer insulation layer (50A) is formed on first surface (F) of core substrate 30 and on first conductive circuit (34A). Upper first interlayer insulation layer (50A) has a first surface and a second surface opposite the first surface. The second surface of upper first interlayer insulation layer (50A) faces the first surface of the core substrate. Conductive circuit (58A) is formed on the first surface of upper first interlayer insulation layer (50A). Conductive circuit (58A) on upper first interlayer insulation layer (50A) is connected to first conductive circuit (34A) or through-hole conductor 36 by via conductor (60A) penetrating through upper first interlayer insulation layer (50A).

Upper second interlayer insulation layer (150A) is formed on the first surface of first interlayer insulation layer (50A). Upper second interlayer insulation layer (150A) has a first surface and a second surface opposite the first surface. The second surface of upper second interlayer insulation layer (150A) faces first surface (F) of first interlayer insulation layer (50A). Conductive circuit (158A) is formed on the first surface of upper second interlayer insulation layer (150A). Conductive circuit (158A) on upper second interlayer insulation layer (150A) is connected to conductive circuit (58A) or via conductor (60A) by via conductor (160A) penetrating through upper second interlayer insulation layer (150A).

Lower first interlayer insulation layer (50B) is formed on second surface (S) of core substrate 30 and on the second conductive circuit. Lower first interlayer insulation layer (50B) has a first surface and a second surface opposite the first surface. The second surface of lower first interlayer insulation layer (50B) faces the second surface of the core substrate. Conductive circuit (58B) is formed on the first surface of lower first interlayer insulation layer (50B). Conductive circuit (58B) on lower first interlayer insulation layer (50B) is connected to second conductive circuit (34B) or through-hole conductor 36 by via conductor (60B) penetrating through lower first interlayer insulation layer (50B).

Lower second interlayer insulation layer (150B) is formed on the first surface of first interlayer insulation layer (50B). Lower second interlayer insulation layer (150B) has a first surface and a second surface opposite the first surface. The second surface of lower second interlayer insulation layer (150B) faces the first surface of first interlayer insulation layer (50B). Conductive circuit (158B) is formed on the first surface of lower second interlayer insulation layer (150B). Conductive circuit (158B) on lower second interlayer insulation layer (150B) is connected to conductive circuit (58B) or via conductor (60B) by via conductor (160B) penetrating through lower second interlayer resin insulation layer (150B).

Upper solder-resist layer (70A) is formed on the first surface of upper second interlayer insulation layer (150A), and lower solder-resist layer (70B) is formed on the first surface of lower second interlayer insulation layer (150B). Upper and lower solder-resist layers (70A, 70B) have opening portions (71A, 71B) which expose via conductors (160A, 160B) and conductive circuits (158A, 158B). Upper surfaces of the via conductors and conductive circuits exposed through opening portions (71A, 71B) work as solder pads (73A, 73B). Solder bumps (76A, 76B) are formed on solder pads (73A, 73B).

FIG. 12 shows magnified views of metal member 20 where core substrate 30 in FIG. 6 is present in the center. Copper or an Fe—Ni alloy is preferred for the material of metal member 20. Since copper or Fe—Ni alloys have greater thermal conductivity, heat is diffused in the core substrate, and thermal stress caused by uneven heat distribution in the core substrate is suppressed from being generated. Metal member 20 has a thickness of 20 μm~100 μm. If the thickness of metal member 20 is 20 μm or less, effects of thermal diffusion are obtained. On the other hand, if the thickness of metal member 20 is 100 μm or greater, warping occurs because of the difference in thermal expansion coefficients with insulation layers of the core substrate. The upper surface and the opposite lower surface are each roughened for ensuring adhesiveness with a first insulation layer and a second insulation layer to be laminated on surfaces of metal member 20. Their surface roughness is preferred to be in the range of Rz=2.0~6.0 μm. If the Rz is smaller than 2.0 μm, adhesiveness is lowered, and if the Rz is greater than 6.0 μm, the flatness of the insulation layers is degraded. Their surface roughness is measured by a laser microscope made by Keyence, for example. It is an option to make the surface roughness different on the first surface and the second surface of metal member 20 (FIG. 12(A)). It is preferred that the surface roughness of first surface (F) be Rz=3.5~6.0 μm, and the surface roughness of second surface (S) be Rz=2.0~3.0 μm. When an IC chip is mounted, since the side opposite where the IC chip is mounted is in a convex form, higher adhesiveness is required on the concave side.

Plated film may be formed on the first surface and second surface of metal member 20. For example, as shown in FIG. 12(B), the core section of metal member 20 is made of Fe—Ni alloy layer (20a) and of copper-plated film (20b) formed on the upper and lower surfaces of the Fe—Ni layer. The thickness of metal member 20 is adjusted by plating. Moreover, by roughening or making a concavo-convex form (FIG. 12(C)) on the surface of copper-plated film (20b), adhesiveness with insulation layers is enhanced.

Metal member 20 of core substrate 30 is used as a power-source conductor, and via conductors (38A, 38B) connected to metal member 20 are used for power source. On the other hand, through-hole conductor 36 is used for signals. Metal member 20 may also be used as a ground conductor.

Figure 9:
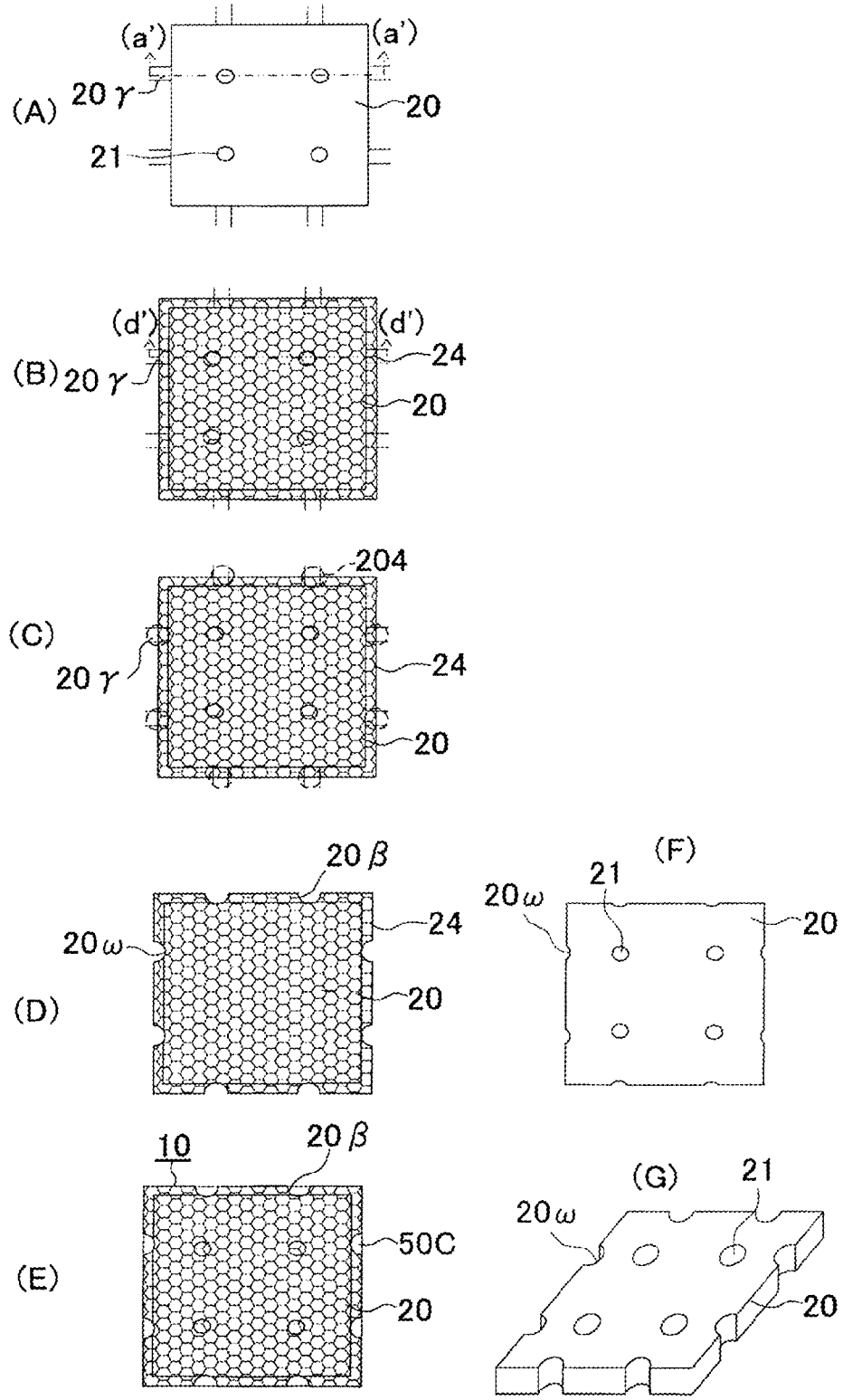
FIGS. 9(A)-9(G) are plan views during processing steps of a metal board according to the first embodiment.

FIG. 9(E) is a view of metal member 20 in FIG. 6 projected from a lamination direction. In FIG. 9(D), metal member 20 is cut from connector members (20γ) connected to other metal members 20. Each connector member (20γ) is cut by a drill so that it does not protrude from metal member 20. Accordingly, on a side surface of metal member 20, metal member 20 has recessed portion (20ω) that is formed in an arc shape recessed toward the center of metal member 20 in a planar direction. Since connector member (20γ) is cut by a drill, stress seldom travels to metal member 20 during cutting, and concavo-convex forms, caused when metal member 20 is warped due to stress, are prevented from occurring on the surfaces of insulation layers. Thus, it is easier to maintain flat surfaces. Since buildup interlayer insulation layers and conductive circuits are laminated on flat insulation layers, reliability of conductive circuits is enhanced.

By forming upper first interlayer insulation layer (50A) on the first surface of core substrate 30 and the first conductive circuit, and forming lower first interlayer insulation layer (50B) on the second surface and the second conductive circuits, resin (50C), which seeps out from first interlayer insulation layer (50A) and first interlayer insulation layer (50B), is filled in recessed portion (20ω) recessed at a side surface of metal member 20 toward the center of metal member 20 in a planar direction. Filling resin (50C) is derived from at least either first interlayer insulation layer (50A) or first interlayer insulation layer (50B). Interlayer insulation layers may contain inorganic fiber such as glass fiber.

Recessed portion (20ω) at a side of core substrate 30 in FIG. 6, formed in an arc shape to recess toward the center of metal member 20 in a planar direction, is filled with resin (50C), and there is a region at each side surface of substrate 10 where inorganic fiber forming an insulation layer is not present. At the border of recessed portion (20ω) and resin (50C), stress is less likely to be concentrated due to its shape. Thus, cracking originating in recessed portion (20ω) does not occur in resin (50C); or insulation layers (24A, 24B) are not removed from metal member 20.

Through-hole conductor 36 formed in core substrate 30 in FIG. 6 is formed in second penetrating hole 28 made up of first opening portion (28A), second opening portion (28B) and third opening portion (28C) which penetrate through core substrate 30, and connects first conductive circuit (34A) and second conductive circuit (34B). Through-hole conductor 36 is made of plated metal filled in second penetrating hole 28. The metal is preferred to be copper. Second penetrating hole 28 is made up of first opening portion (28A) formed by irradiating a laser from the first-surface (F) side of core substrate 30 toward the second surface, of second opening portion (28B) formed by irradiating a laser from the second-surface (S) side of the core substrate toward the first surface, and of third opening portion (28C) formed by irradiating a laser at penetrating hole 21 filled with resin material.

A straight line passing through the gravity center of first opening portion (28A) and perpendicular to the first surface of the core substrate may be offset from a straight line passing through the gravity center of second opening portion (28B) and perpendicular to the second surface of the core substrate. If first opening portion (28A) and second opening portion (28B) are joined at third opening portion (28C) while being offset from each other, the surface area of the inner walls of second penetrating hole 28 becomes greater than otherwise, thus adhesiveness is enhanced between through-hole conductor 36, insulation layers and resin material.

In the above embodiment, through-hole conductor 36 made by filling plated metal tapers from first surface (F) (upper surface) of core substrate 30 toward the second surface (S) (lower surface) side, while also tapering from the second surface toward the first-surface side. Then, the diameter of through-hole conductor 36 reaches the minimum in third opening portion (28C). At that time, since the distance reaches the maximum between through-hole conductor 36 as a signal conductor and metal member 20 as a power-source conductor, the impact from noise decreases. Regarding the location where the diameter of through-hole conductor 36 reaches the minimum in third opening portion (28C), the distance from the first surface of metal member 20 in a depth direction may be the same as or different from the distance from the second surface in a depth direction.

A description of a method for manufacturing printed wiring board 10 described above with reference to FIGS. 6 and 7 is continued by referring to FIGS. 1-9.

(1) Metal layer 20 is prepared, being made of 35 μm-thick copper with the surface roughness of the first surface being Rz=4.5 μm and the surface roughness of the second surface being Rz=2.5 μm (FIG. 1(A)).

(2) As shown in FIG. 1(B), to form first penetrating hole 21 for a through hole, metal member 20 and connector member (20γ), etching resist is formed on the first surface and the second surface of metal layer 20. Opening portions (22a) of the etching resist on the first surface and the second surface of metal layer 20 are formed to be positioned at the same spots facing the metal layer.

(3) By etching metal layer 20 exposed through opening portions (22a) under the same conditions, metal sheet 200 (metal layer 20) is formed with multiple metal members 20 having first penetrating holes 21 for through holes and with connector members (20γ) (FIG. 1(C): FIG. 8(A)). During that time, first penetrating hole 21 for a through hole in metal layer 20 is formed in an arc shape seen in its cross-sectional view with a diameter increasing from the first-surface side and the second-surface side of metal layer 20 toward the center, and a recess at a side wall is formed to be 10 μm. Metal member 20, first penetrating hole 21 and connector member (20γ) are formed simultaneously. The diameter of first penetrating hole 21 for a through hole is 230 μm. To form metal members and connector members, blanking may also be used.

(4) After metal sheet 200 is formed, etching-resist film is removed and a coupling agent is applied to the first surface and the second surface of metal layer 20. The purpose is to enhance adhesiveness with insulation layers.

(5) On the first surface and the second surface of metal layer 20, first insulation layer (24A) and second insulation layer (24B) with copper foils (25A, 25B) are formed (FIG. 1(D)). The layer thickness of first insulation layer (24A) and second insulation layer (24B) is 50 μm. The layer thickness of copper foils (25A, 25B) is 5 μm. Insulation layers are made of core material of inorganic fiber or the like such as glass cloth impregnated with resin. Insulation layers may include inorganic filler such as silica and alumina. Regarding the process for forming first insulation layer (24A) and second insulation layer (24B) with copper foils on the first surface and the second surface of metal layer 20, there are two options such as follows: single-sided first insulation layer (24A) and second insulation layer (24B) with copper foil are laminated respectively on the first surface and the second surface of metal layer 20; or first insulation layer (24A) and copper foil (25A) as well as second insulation layer (24B) and copper foil (25B) are simultaneously laminated on the first surface and the second surface of metal layer 20 respectively. Either process may be employed. During the lamination, resin material (24C) that seeps from at least either first insulation layer (24A) or second insulation layer (24B) is filled in first penetrating hole 21 formed in metal member 20 (FIG. 1(E)). A plan view of first insulation layer (24A) and second insulation layer (24B) laminated on metal member 20 is shown in FIG. 9(B) (cross section at (d-d)).

(6) After copper foils (25A, 25B) are laminated on surfaces of first insulation layer (24A) and second insulation layer (24B), a black-oxide treatment is conducted on surfaces of copper foils (25A, 25B) (not shown in the drawings). Laser absorption is required to be improved for laser processing to form penetrating holes for through holes.

(7) From the first surface of core substrate 30 toward the second surface, a CO2 gas laser is irradiated at the first surface to correspond to the position of first penetrating hole 21. Accordingly, first opening portion (28A) penetrating through at least first insulation layer (24A) is formed on the first-surface side of core substrate 30. The opening diameter of first opening (28A) is 80 μm. However, the pulse width and the number of shots when irradiating a laser are not limited specifically. By irradiating a CO2 gas laser from the first surface of core substrate 30 toward the second surface, via opening portion (26a) penetrating through first insulation layer (24A) is formed on the first surface of metal member 20 (FIG. 1(F)). The opening diameter of the via opening is 75 μm. First opening portion (28A) and via opening portion (26a) are formed consecutively.

(8) From the second surface of core substrate 30 toward the first surface, a CO2 gas laser is irradiated at the second surface to correspond to the position of first penetrating hole 21. Accordingly, second opening portion (28B) penetrating through at least second insulation layer (24B) is formed on the second-surface side of core substrate 30. The opening diameter of second opening (28B) is 80 μm. However, the pulse width and the number of shots when irradiating a laser are not limited specifically. By irradiating a CO2 gas laser from the second surface of core substrate 30 toward the first surface, via opening portion (26b) penetrating through second insulation layer (24B) is formed on the second surface of metal member 20 (FIG. 2(A)). The opening diameter of the via opening is 75 μm. Second opening portion (28B) and via opening portion (26b) are formed consecutively. Second penetrating hole 28 is formed with first opening portion (28A) and second opening portion (28B).

First opening portion (28A) is an opening portion which penetrates through first insulation layer (24A), second opening portion (28B) is an opening portion which penetrates through second insulation layer (24B), and third opening portion (28C) is an opening portion which penetrates through the resin material in the first penetrating hole. When first opening portion (28A) and second opening portion (28B) are joined in third opening portion (28C), second penetrating hole 28 is formed. First opening portion (28A) tapers from the first-surface (F) side of core substrate 30 toward second surface (S). Second opening portion (28B) tapers from the second-surface (S) side of core substrate 30 toward first surface (F). The diameter of second penetrating hole 28 decreases toward the center of core substrate 30, and its minimum diameter is 40 μm. The minimum diameter of second penetrating hole 28 corresponds to the minimum diameter of third opening portion (28C). Regarding the position where the diameter of second penetrating hole 28 reaches the minimum in core substrate 30, the distance from the first surface of metal member 20 in a depth direction may be the same as or different from the distance from the second surface in a depth direction in third opening portion (28C).

Straight lines which pass through the gravity centers of laser openings that respectively form first opening portion (28A) and second opening portion (28B) and which are perpendicular to the first surface of the core substrate may overlap or may be offset. If first opening portion (28A) and second opening portion (28B) are joined at third opening portion (28C) while being offset from each other, the surface area of the inner walls of second penetrating hole 28 becomes greater than otherwise, thus adhesiveness is enhanced between through-hole conductor 36, insulation layers and resin material.

A method for forming second penetrating hole 28 is not limited to the above. A penetrating hole may also be formed by irradiating a laser only from either the first surface or the second surface of core substrate 30. If a laser is irradiated from one direction, defects would not occur such as failure to make an opening due to shifted positions of laser holes irradiated from both surfaces. Also, a drill may be used for forming a penetrating hole.

(9) On the surfaces of core substrate 30 where second penetrating hole 28 for a through hole and via openings (26a, 26b) are formed, on the inner wall of second penetrating hole 28 and on the inner walls of via openings, electroless plating is performed to form electroless plated film 31 (FIG. 2(B)).

(10) Photosensitive dry film is laminated on copper foils where electroless plated film is formed, exposed to light and developed. Accordingly, plating resist 40 with a predetermined pattern is formed (FIG. 2(C)).

(11) Electrolytic plating is performed to form electrolytic plated film 32 where plating resist 40 is not formed, thus forming conductive circuit 34, through-hole conductor 36 made by filling second penetrating hole 28 with plating, and via conductors (38A, 38B) made by filling openings (26a, 26b) with plating (FIG. 2(D)).

(12) Plating resist 40 is removed, electroless plated film 31 and copper foils (25A, 25B) under plating resist 40 are etched away, conductive circuits (34A, 34B), through-hole conductor 36 and via conductors (38A, 38B) are formed, and core substrate 30 is completed (FIG. 2(E)). The layer thickness of conductive circuits (34A, 34B) is 15 μm.

(13) Drill 204 is aligned at connector member (20γ) of metal member 20. FIG. 9(C) is a plan view of a unit of metal member 20 showing cut portions of connector members by drill 204. FIG. 8(B) is a plan view of sheet 200 for forming multiple individual units showing cut portions of connector members by drill 204.

(14) Two connector members (20γ) on each side surface of metal member 20 are cut by a drill (FIG. 3(A)). FIG. 9(D) is a plan view of metal member 20 and insulation layer 24 (cross section at (a2-a2)) where eight connector members (20γ) are cut. Two recessed portions (20ω) in a concave form are formed on each of four side surfaces of metal member 20 by a drill. FIG. 9(F) is a plan view and FIG. 9(G) is a perspective view of metal member 20 where recessed portions (20ω) are formed. If a drill is used for cutting, stress seldom travels to metal member 20 while cutting connector members (20γ). Thus, concavo-convex forms, caused when metal member 20 is warped due to stress, are prevented from occurring on surfaces of insulation layers (24A, 24B), and it is easier to maintain flat surfaces.

(15) First interlayer insulation layer (50A) and first interlayer insulation layer (50B) are formed on both surfaces of core substrate 30 after the above procedures (see FIG. 3(B)). Each layer thickness of first interlayer insulation layer (50A) and first interlayer insulation layer (50B) is 50 μm. During that time, resin (50C) which has seeped at least from either first interlayer insulation layer (50A) or first interlayer insulation layer (50B) is filled in cut holes of connector members (20γ) formed by a drill. FIG. 9(E) is a plan view (cross section at (b2-b2)) showing a state in which resin (50C), which has seeped from either first interlayer insulation layer (50A) or first interlayer insulation layer (50B), is formed on side portions of metal member 20.

(16) Via openings (51A, 51B) with a diameter of 75 μm are formed in interlayer insulation layers (50A, 50B) using a CO2 gas laser (see FIG. 3(C)). By immersing in an oxidation agent or the like such as chromic acid and permanganate, surfaces of interlayer insulation layers (50A, 50B) are roughened (not shown in the drawings).

(17) By attaching a catalyst such as palladium on surface layers of interlayer insulation layers (50A, 50B) in advance, and then by immersing in an electroless plating solution for 5~60 minutes, electroless plated film 52 is formed in a range of 0.1~5 μm (FIG. 3(D)).

(18) Photosensitive dry film is laminated on substrate 30 after the above procedure, exposed to light and developed. Accordingly, plating resist 54 with a predetermined pattern is formed (FIG. 4(A)).

(19) Electrolytic plating is performed to form electrolytic plated film 56 on opening portions of plating resist (see FIG. 4(B)).

(20) After plating resist 54 is removed by 5% NaOH, electroless plated film 52 under the plating resist is dissolved and removed by etching using a mixed solution of nitric acid, sulfuric acid and hydrogen peroxide, forming conductive circuits (58A, 58B) and via conductors (60A, 60B) made of electroless plated film 52 and electrolytic plated film 56 (FIG. 4(C)). Surfaces of conductive circuits (58A, 58B) and via conductors (60A, 60B) are roughened by an etching solution containing copper (II) complex and organic acid (not shown in the drawings).

(21) Through the same procedures as in above (16)~(20), interlayer insulation layers (150A, 150B) having conductive circuits (158A, 158B) and via conductors (160A, 160B) are formed (FIG. 5(A)).

(22) A commercially available solder-resist composition is applied, exposed to light and developed to form solder-resist layers (70A, 70B) having openings (71A, 71B) (FIG. 5(B)). The layer thickness of solder-resist layers (70A, 70B) is 15 μm.

(23) The substrate is immersed in an electroless nickel plating solution to form 5 μm-thick nickel-plated layer 72 in openings (71A, 71B). In addition, the substrate is immersed in an electroless gold-plating solution to form 0.03 μm-thick gold-plated layer 74 on nickel-plated layer 72 (FIG. 5(C)). Instead of nickel-gold layers, nickel-palladium-gold layers may be formed.

(24) Next, solder balls are loaded in openings (71A) and a reflow is conducted. Accordingly, solder bump (76A) is formed on the first-surface (upper-surface) side, and solder bump (76B) is formed on the second-surface (lower-surface) side to complete printed wiring board 10 (FIG. 6). Then, by cutting along two-dot chain lines Z shown in FIG. 8(B), individual printed wiring boards are obtained. Those two-dot chain lines Z pass through drilled penetrating holes. Since inorganic fiber is not present on four side surfaces of printed wiring board 10, portions filled with resin that has seeped from an interlayer insulation layer are exposed in drilled penetrating holes.

Figure 7:
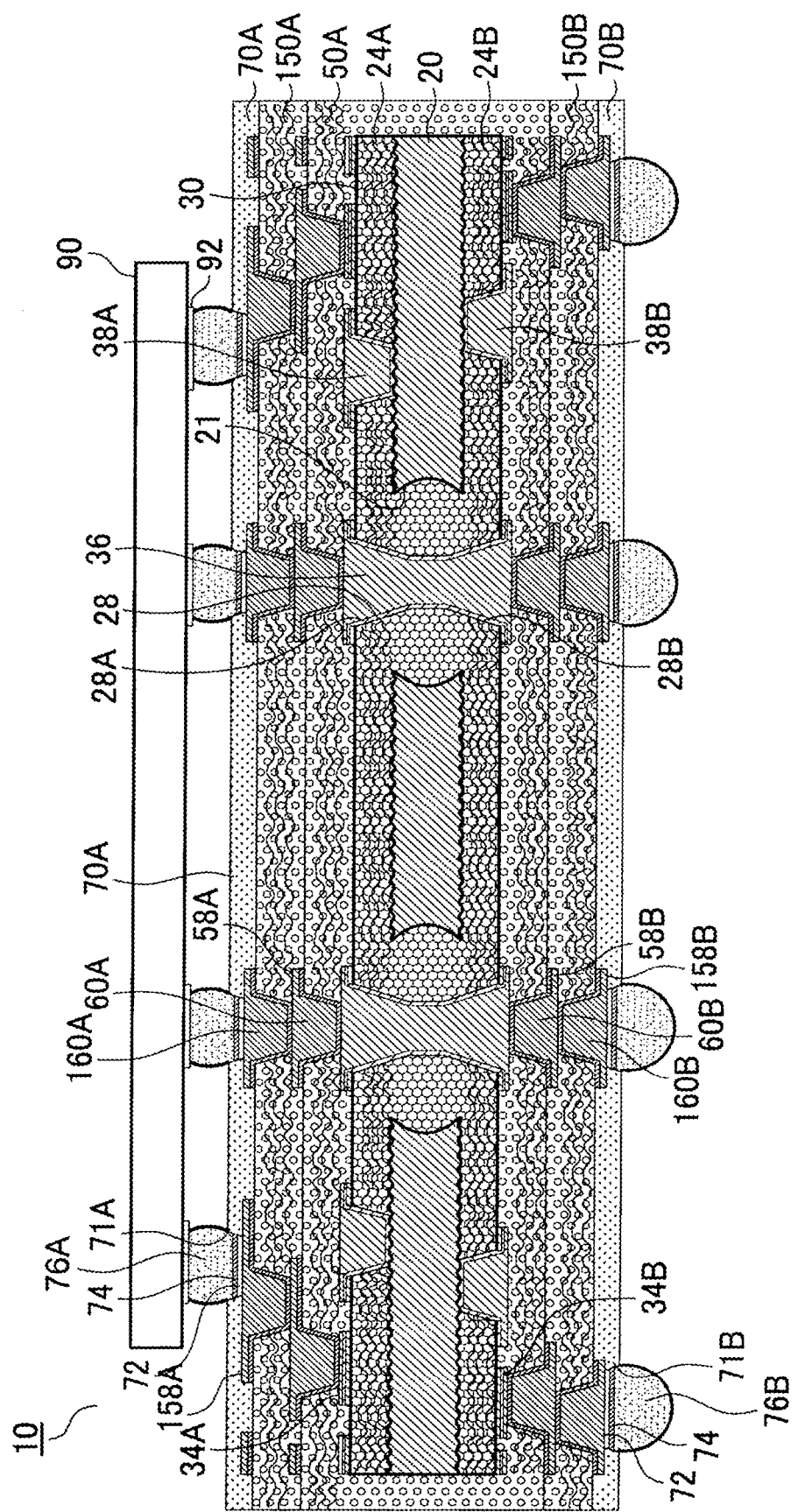
FIG. 7 is a cross-sectional view showing a state in which an IC chip is mounted on the printed wiring board shown in FIG. 6.
Figure 8:
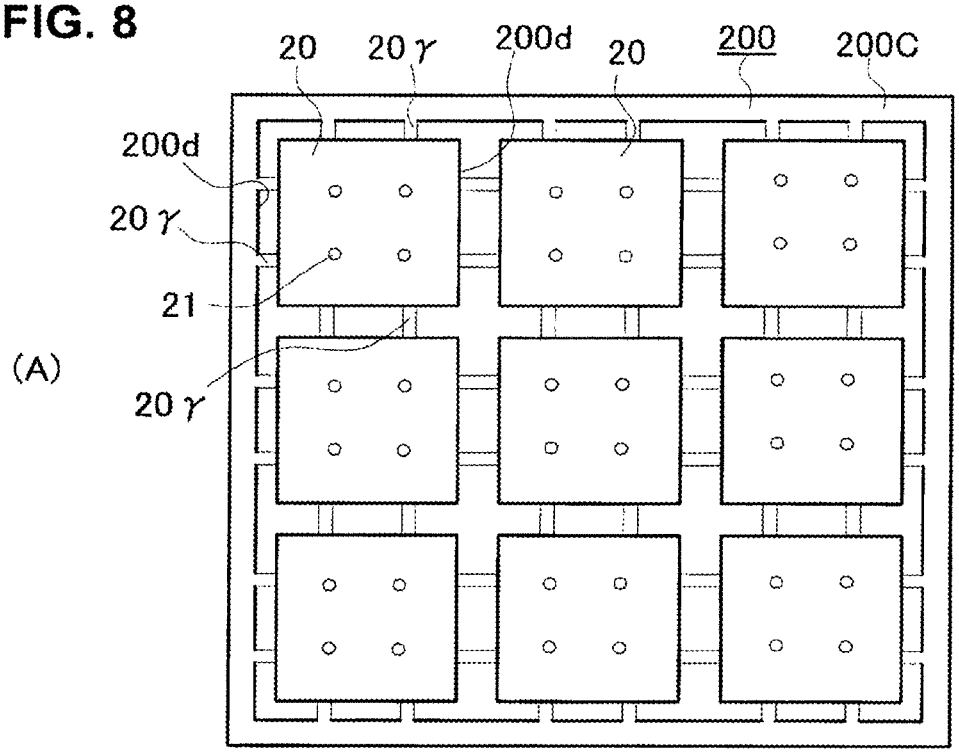
FIG. 8 is a plan view of a metal sheet containing metal members according to the first embodiment.
Figure 8:
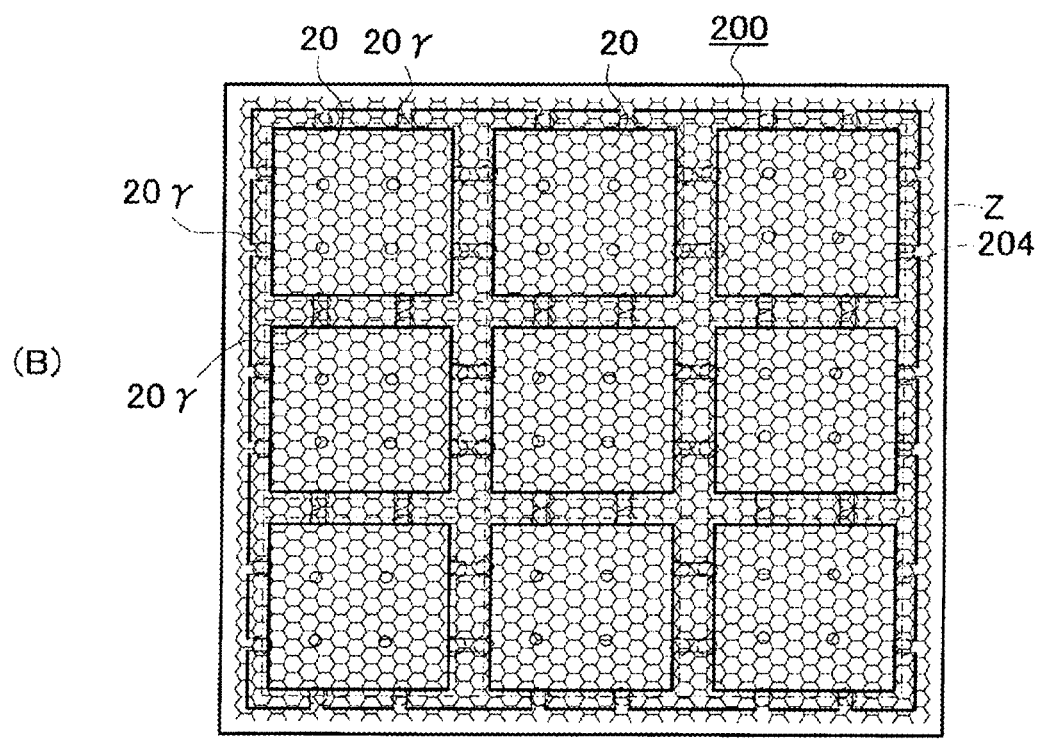

IC chip 90 is mounted on printed wiring board 10 by connecting pad 92 of IC chip 90 with solder bump (76A) (FIG. 7).

In a method for manufacturing a printed wiring board according to the first embodiment, metal sheet 200 for forming multiple individual units is used where each side of metal members 20 is supported by connector members (20γ). After insulation layers (24A, 24B) are laminated, two connector members (20γ) at each side surface of metal members 20 are cut using a drill. At that time, to prevent connector members (20γ) from protruding from metal member 20, recessed portions are formed in an arc shape recessed toward the center in a planar direction. Thus, thermal stress is not concentrated on a specific portion of metal member 20, and cracking seldom occurs during heat cycles in connected portions of metal member 20, insulation layers (24A, 24B) and interlayer insulation layers (50A, 50B), thereby enhancing reliability. Also, when connector members (20γ) are cut, since stress seldom travels to metal member 20, concavo-convex forms, caused when metal member 20 is warped due to stress, are prevented from occurring on the surfaces of insulation layers (24A, 24B). Thus, it is easy to maintain flat surfaces. Accordingly, when laminating buildup interlayer insulation layers (50A, 50B, 150A, 150B), conductive circuits (58A, 58B, 158A, 158B) and via conductors (60A, 60B, 160A, 160B), since they are laminated on flat insulation layers (24A, 24B), reliability is enhanced in conductive circuits (58A, 58B, 158A, 158B).

Second Embodiment

A multilayer printed wiring board according to a second embodiment of the present invention is described with reference to a cross-sectional view in FIG. 6. Printed wiring board 10 in the second embodiment is formed by laminating buildup interlayer insulation layers (50A, 50B, 150A, 150B) and conductive circuits (58A, 58B, 158A, 158B) on both surfaces of core substrate 30, the same as in the first embodiment.

In printed wiring board 10, core substrate 30 is formed by laminating insulation layers (24A, 24B) on a first surface and a second surface of metal member 20. Conductive circuits (34A, 34B) are formed on first surface (F) and second surface (S) of core substrate 30. Core substrate 30 is formed to be smaller than printed wiring board 10, and interlayer insulation layers 50 are positioned on the periphery of core substrate 30. Conductive circuit (34A) on first surface (F) of core substrate 30 and conductive circuit (34B) on second surface (S) are connected by through-hole conductor 36. In addition, metal member 20 and conductive circuits 34 are connected by via conductors (38A, 38B) penetrating through insulation layers 24.

On first surface (F) and second surface (S) of core substrate 30, interlayer insulation layers (50A, 50B) are arranged where via conductors (60A, 60B) and conductive circuits (58A, 58B) are formed as well as interlayer insulation layers (150A, 150B) where via conductors (160A, 160B) and conductive circuits (158A, 158B) are formed. Solder-resist layers (70A, 70B) are formed on via conductors (160A, 160B) and conductive circuits (158A, 158B), and bumps (76A) are formed on via conductor (160A) and conductive circuit (158A) in the center of the first surface through openings (71A, 71B) of solder-resist layers (70A, 70B). Bumps (76B) are formed on the second surface.

Figure 10:
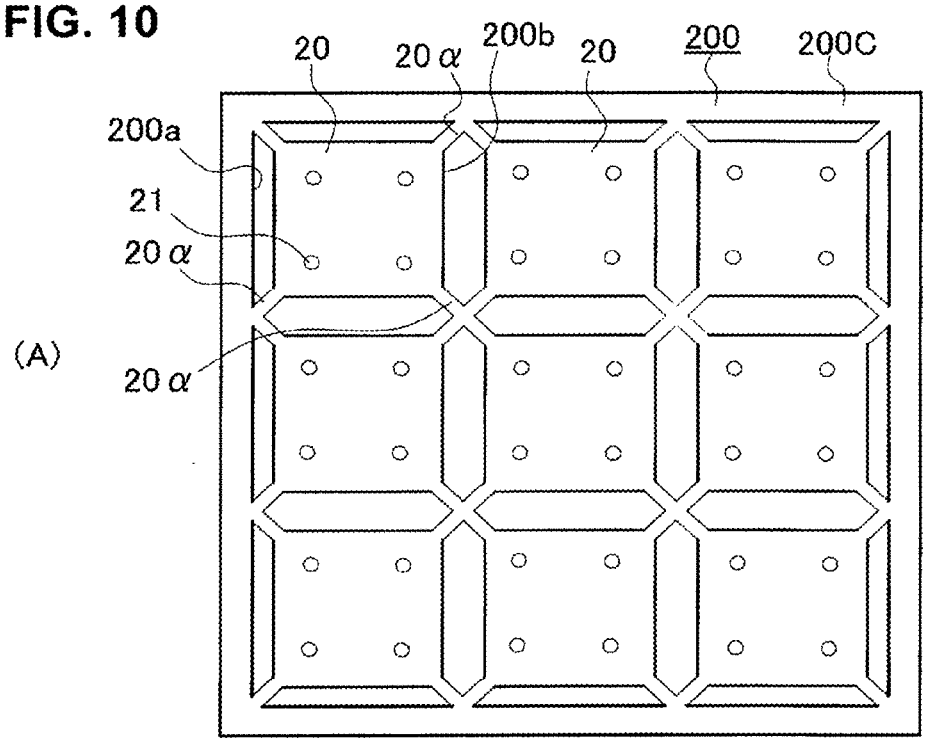
FIG. 10 is a plan view of a metal sheet containing metal boards according to a second embodiment.
Figure 10:
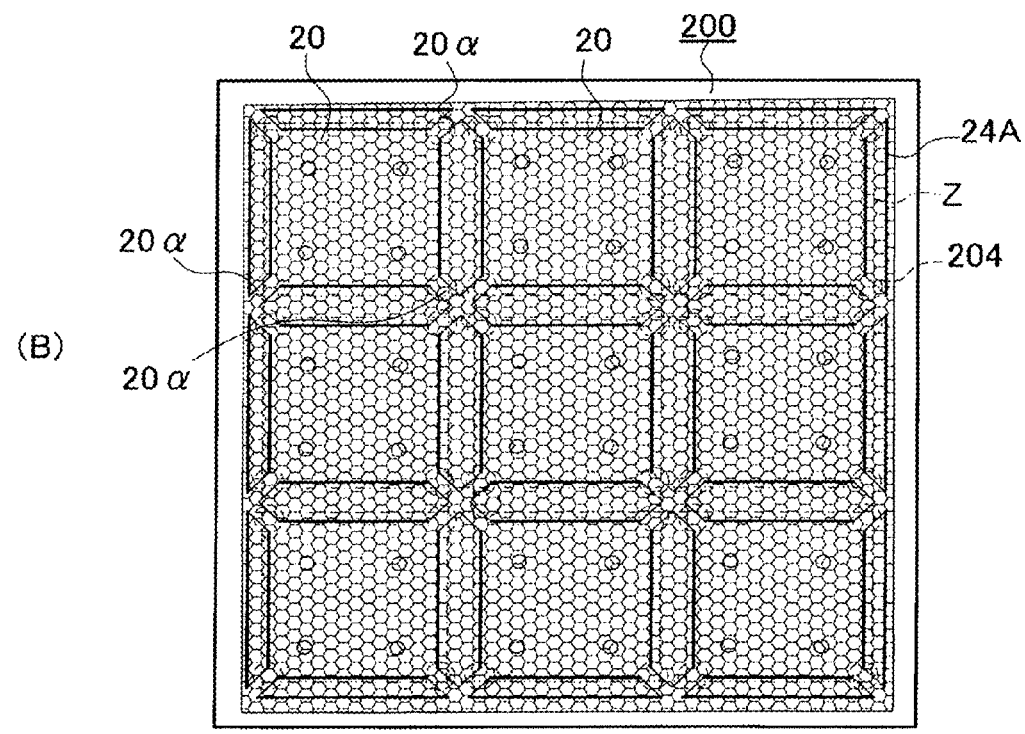
Figure 11:
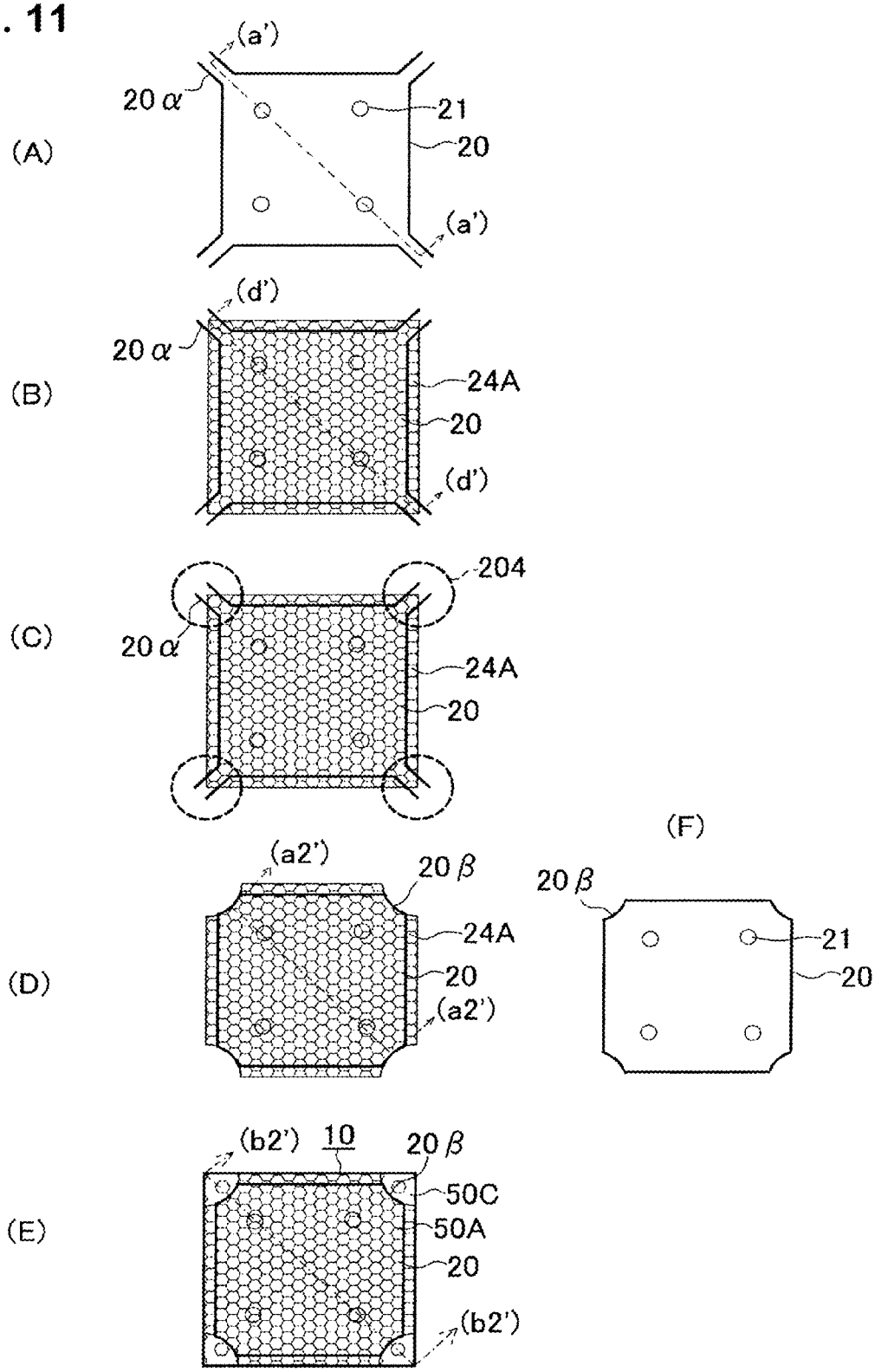
FIGS. 11(A)-11(F) are plan views during processing steps of a metal member according to the second embodiment.

FIG. 11(E) is a plan view of metal member 20. As described above with reference to FIG. 10, the core substrate (metal board 20) is formed to be smaller than printed wiring board 10, and interlayer insulation layers (50A, 50B) are arranged on the periphery of metal member 20.

Next, a method for manufacturing printed wiring board 10 is described according to the second embodiment by referring to FIGS. 1~6.

A metal layer sheet made of 70 μm-thick copper or an Fe—Ni alloy is prepared, and as shown in FIG. 1(B), photosensitive dry film is laminated on a first surface and a second surface of metal layer 20, exposed to light and developed to form etching patterns. By etching opening portions (22a) of etching-resist film using an etching solution, metal sheet 200 for forming multiple individual units is formed with multiple metal members 20 having penetrating holes 21 for through holes and with connector members (20α) connecting and supporting angular portions of metal members 20 (FIG. 10(A)). When forming metal members 20 and connector members (20α), blanking may also be used.

FIG. 11(A) shows a unit of metal member 20 and connector members (20α) supporting the metal member 20 in sheet 200 for forming multiple individual units shown in FIG. 10(A) described above by referring to FIG. 10(A). FIG. 1(C) shows a cross section of metal member 20 and connector member (20α) at (a'-a'). The next step is the same as that in the first embodiment described above with reference to FIG. 1(D).

On the first surface and second surface of metal member 20, laminated are 50 μm-thick insulation layers (24A, 24B) made by impregnating core material such as glass fiber with resin containing inorganic particles to adjust the thermal expansion coefficient. During lamination, first penetrating hole 21 is filled with resin (24C) that has seeped from an insulation layer (FIG. 1(E)). FIG. 11(B) shows a plan view (cross section at (d'-d')) of insulation layer (24A) laminated on metal member 20. Since the subsequent steps are the same as those in the first embodiment described above with reference to FIGS. 1(F)~2(D), their descriptions are omitted.

Core substrate 30 is completed (FIG. 1(E)). Then, drill 204 is aligned at connector member (20α) of metal member 20. FIG. 11(C) is a plan view of a unit of metal member 20 showing cut portions of connector members (20α) by drill 204. FIG. 10(B) is a plan view of sheet 200 for forming multiple individual units showing cut portions of connector members (20α) by drill 204.

Connector members (20α) of metal member 20 are cut by a drill (FIG. 3(A)). FIG. 11(D) is a plan view (cross section at (a2'-a2')) of metal member 20 and insulation layer 24 where connector members (20α) are cut. FIG. 11(F) is a plan view of metal member 20. At angular portions of metal member 20, recessed portions (20β) are formed in an arc shape recessed toward the center in a planar direction.

Interlayer insulation layers (50A, 50B) are formed on both surfaces of core substrate 30 after the above procedures (see FIG. 3(B)). FIG. 11(E) shows a plan view (cross section at (b2'-b2')) of interlayer insulation layer (50A). At that time, drilled penetrating holes are filled with resin that has seeped from an interlayer insulation layer. Resin material (50C) is formed on side portions of core substrate 30. Although the directions of cross sections are different, the plan view (cross section at (b2'-b2')) where resin material (50C) is formed on side portions of metal member 20 is the same as the plan view (cross section at (b2-b2)) in the first embodiment. At four angular portions of printed wiring board 10, cross sections of resin material (50C), which does not contain inorganic fiber and which is the resin that has seeped from an interlayer insulation layer and is filled in drilled penetrating holes, are exposed. Since the subsequent steps are the same as those in the first embodiment, their descriptions are omitted.

In a method for manufacturing a printed wiring board according to the second embodiment, metal sheet 200 for forming multiple individual units is used where each side of metal members 20 is supported by connector members (20α). After insulation layers (24A, 24B) are laminated, connector members (20α) at angular portions of metal members 20 are cut using a drill. At that time, to prevent connector members (20α) from protruding from metal member 20, recessed portions are formed in an arc shape recessed toward the center in a planar direction. Thus, thermal stress is not concentrated at angular portions of metal member 20, and cracking seldom occurs during heat cycles in connected portions of metal member 20, insulation layers (24A, 24B) and interlayer insulation layers (50A, 50B). Accordingly, reliability is enhanced. Also, when connector members (20α) are cut, stress seldom travels to metal member 20, and concavo-convex forms, caused when metal member 20 is warped due to stress, are prevented from occurring on the surfaces of insulation layers (24A, 24B). Thus, it is easier to maintain flat surfaces. Accordingly, when laminating buildup interlayer insulation layers (50A, 50B, 150A, 150B), conductive circuits (58A, 58B, 158A, 158B) and via conductors (60A, 60B, 160A, 160B), since they are laminated on flat insulation layers (24A, 24B), reliability is enhanced in conductive circuits (58A, 58B, 158A, 158B).

A manufacturing method according to an embodiment of the present invention includes the following: preparing a metal layer which is formed with multiple metal members and connectors joining individual metal members and which has a first surface and a second surface opposite the first surface; forming first penetrating holes in the metal members; forming a first insulation layer on the first surface of the metal layer; forming a second insulation layer on the second surface of the metal layer; filling resin material in the first penetrating holes; forming second penetrating holes in the first insulation layer, the second insulation layer and the resin material; forming first conductive circuits and second conductive circuits on the first insulation layer and the second insulation layer respectively; in the second penetrating holes, forming through-hole conductors connecting the first conductive circuits and the second conductive circuits; cutting the connectors; on a side surface of the metal member, forming a recessed portion recessed toward the center of the metal member in a planar direction; forming a first interlayer insulation layer on the first insulation layer; forming a second interlayer insulation layer on the second insulation layer; and filling in the recessed portion at least either the first interlayer insulation layer or the second interlayer insulation layer.

According to the method for manufacturing a printed wiring board above, by using a drill to cut multiple metal members and connectors joining individual metal members, recessed portions are formed in an arc shape recessed toward the center in a planar direction so that the connectors are prevented from protruding from the metal members. Since the connectors do not remain as protruding portions, peeling and cracking caused by thermal expansion differences generated at protruding portions are prevented, enhancing the reliability of conductive circuits.

According to the method for manufacturing a printed wiring board above, by using a drill to cut multiple metal members and connectors joining individual metal members, stress during cutting seldom travels to the metal members, and thus concavo-convex forms caused by warping of the metal board due to stress are prevented from occurring on surfaces of insulation layers, and it is easier to maintain flat surfaces. Since buildup interlayer insulation layers and conductive circuits are laminated on flat insulation layers, the reliability of conductive circuits is enhanced.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
a core substrate having a first surface and a second surface on an opposite side of the first surface of the core substrate;
a first conductive circuit formed on the first surface of the core substrate;
a second conductive circuit formed on the second surface of the core substrate;
a through-hole conductor formed through the core substrate and connecting the first conductive circuit and the second conductive circuit;
a first interlayer insulation layer formed on the first conductive circuit; and
a second interlayer insulation layer formed on the second conductive circuit,
wherein the core substrate comprises an insulation structure and a metal member positioned inside the insulation structure, the metal member has a penetrating hole through which the through-hole conductor is passing through, the metal member has a recessed portion on a peripheral portion of the metal member, and the recessed portion is covered with a resin derived from at least one of the first interlayer insulation layer and the second interlayer insulation layer.

2. The printed wiring board according to claim 1, wherein the insulation structure has a first insulation layer portion formed on one side of the metal member, a second insulation layer portion formed on an opposite side of the metal member, and a filling portion filling the penetrating hole, and the through-hole conductor is formed through a first opening portion formed in the first insulation layer portion, a second opening portion formed in the second insulation layer portion and a third opening portion formed in the filling portion.

3. The multilayer printed wiring board according to claim 2, wherein the filling portion comprises a resin derived from at least one of the first insulation layer portion and the second insulation layer portion.

4. The multilayer printed wiring board according to claim 1, wherein the metal member has a thickness of 20 μm to 100 μm.

5. The multilayer printed wiring board according to claim 1, wherein the recessed portion of the metal member has an arc shape.

6. The multilayer printed wiring board according to claim 1, wherein the metal member has at least one roughened surface which has Rz=2.0~6.0 μm.

7. The multilayer printed wiring board according to claim 1, wherein the metal member has a first roughened surface and a second roughed surface on an opposite side of the first roughened surface, and the first roughened surface has a roughness which is different for a roughness of the second roughened surface.

8. The multilayer printed wiring board according to claim 1, wherein the metal member has a first roughened surface and a second roughed surface on an opposite side of the first roughened surface, the first roughened surface has Rz=3.5~6.0 μm, and the second roughened surface has Rz=2.0~3.0 μm.

9. The multilayer printed wiring board according to claim 1, wherein the metal member forms one of a power source conductor layer and a ground conductor layer.

10. The multilayer printed wiring board according to claim 1, wherein the through-hole conductor forms a signal line.

11. The multilayer printed wiring board according to claim 1, wherein the metal member is made of one of copper and an Fe—Ni alloy.

12. The multilayer printed wiring board according to claim 1, further comprising a plated film formed on a first surface of the metal member and a second surface of the metal member on an opposite side of the first surface of the metal member.

13. The multilayer printed wiring board according to claim 11, wherein the plated film has a concavo-convex pattern on at least one of the first surface and second surface of the metal member.

14. The multilayer printed wiring board according to claim 2, wherein the first opening portion tapers from a first surface of the core substrate toward a second surface of the core substrate on an opposite side of first surface of the core substrate, and the second opening portion tapers from the second surface of the core substrate toward the first surface of the core substrate.

15. The multilayer printed wiring board according to claim 2, wherein the through-hole conductor comprises a plated film filling the first opening portion, the second opening portion and the third opening portion.

* * * * *